(12) United States Patent
Petkie

(10) Patent No.: US 6,531,226 B1
(45) Date of Patent: Mar. 11, 2003

(54) BRAZEABLE METALLIZATIONS FOR DIAMOND COMPONENTS

(75) Inventor: Ronald R. Petkie, Macungie, PA (US)

(73) Assignee: Morgan Chemical Products, Inc., Roseland, NJ (US)

( * ) Notice: Subject to any disclaimer, the term of this patent is extended or adjusted under 35 U.S.C. 154(b) by 0 days.

(21) Appl. No.: 09/584,762

(22) Filed: May 30, 2000

Related U.S. Application Data

(60) Provisional application No. 60/137,264, filed on Jun. 2, 1999.

(51) Int. Cl.[7] .......................... B32B 9/00; B32B 15/00
(52) U.S. Cl. ................ 428/408; 428/216; 428/336; 428/457; 428/469; 428/655; 428/660; 428/661; 428/663; 428/664; 428/665; 428/666
(58) Field of Search ................ 428/408, 469, 428/457, 336, 216, 655, 660, 661, 663, 664, 665, 666; 51/309; 175/243

(56) References Cited

U.S. PATENT DOCUMENTS

| | | |
|---|---|---|
| 3,243,498 A | 3/1966 | Allen et al. |
| 3,351,543 A | 11/1967 | Vanderslice |
| 3,356,473 A | 12/1967 | Hull et al. |
| 4,117,968 A | 10/1978 | Naidich et al. |
| 4,342,632 A | 8/1982 | Heim et al. |
| 4,776,862 A | 10/1988 | Wiand |
| 4,899,922 A | 2/1990 | Slutz et al. |
| 4,931,363 A | 6/1990 | Slutz et al. |
| 5,024,680 A * | 6/1991 | Chen .......................... 51/309 |
| 5,224,969 A * | 7/1993 | Chen et al. ................. 428/408 |
| 5,234,153 A | 8/1993 | Bacon et al. |
| 5,239,746 A | 8/1993 | Goldman |
| 5,250,086 A | 10/1993 | McEachron et al. |
| 5,324,987 A | 6/1994 | Iacovangelo |
| 5,328,715 A | 7/1994 | Iacovangelo et al. |
| 5,348,108 A * | 9/1994 | Scott et al. ................. 175/432 |
| 5,371,407 A | 12/1994 | Goldman |
| 5,382,758 A | 1/1995 | Iacovangelo et al. |
| 5,500,248 A | 3/1996 | Iacovangelo |
| 5,529,805 A | 6/1996 | Iacovangelo |
| 5,567,985 A | 10/1996 | Iacovangelo |
| 5,626,909 A * | 5/1997 | Iacovangelo ................. 51/309 |
| 5,804,321 A | 9/1998 | Thorpe et al. |
| 5,849,113 A | 12/1998 | Zhu et al. |
| 5,853,888 A | 12/1998 | Dutta et al. |

FOREIGN PATENT DOCUMENTS

| | | |
|---|---|---|
| JP | 51094771 A | 8/1976 |
| JP | 62-24647 | 2/1987 |
| JP | 2-226749 | 9/1990 |

OTHER PUBLICATIONS

International Search Report in related Application No. PCT/US01/17345.

Petkie, Ronald, "Packaging Aspects of CVD Diamond in High Performance Electronics Requiring Enhanced Thermal Management," *1998 International Symposium on Advanced Packaging Materials*, Mar. 15–18, 1998, pp. 223–228.

Jahangir, et al., "A highly adhesive gold–based metallization system for CVD diamond substrates," *Proceedings of the Sixth International Symposium (Electrochemical Society Porceedings)*, Honolulu, Hawaii, Oct. 17–22, 1999 (Abstract XP–002178784).

* cited by examiner

*Primary Examiner*—Archene Turner
(74) *Attorney, Agent, or Firm*—Bruce D. Gray; Kristin D. Mallatt; Kilpatrick Stockton LLP

(57) ABSTRACT

A multilayer brazeable metallization structure for diamond components is described. The brazeable metallization finds particular application for the attachment of diamond components such as heat spreaders in electronic packages that incorporate high power semiconductor devices. In the present invention, a diamond component is provided with a multilayer coating of metals including a first layer of chromium for adhesion, a second barrier layer of a refractory metal for a barrier that may be alloyed with chromium, and a top layer of copper, silver or gold for wetting. The refractory metals for the second layer include tungsten, molybdenum, tantalum and niobium. Tungsten or tungsten-chromium alloy is preferred as the second layer. This multilayer metallization structure provides a robust interface between diamond and standard brazing alloys which are used to join the diamond to electrical leads or a flange made of metals such as copper-tungsten. The interfacial adhesion between the metallization and the diamond is sufficient to withstand exposure to brazing at temperatures less than or equal to 1100° C. in inert gas atmospheres that may contain hydrogen.

25 Claims, No Drawings

BRAZEABLE METALLIZATIONS FOR DIAMOND COMPONENTS

This application is based on provisional application Serial No. 60/137,264 filed Jun. 2, 1999.

FIELD OF THE INVENTION

This invention relates to fabricating brazeable diamond products and components for the microelectronic industry that are used as heat spreaders, heat conductors and electrical insulators in electronic packages. More particularly, the product of this invention relates to a multilayer metallization structure that allows diamond to be attached into electronic packages using conventional brazing operations. Still more particularly, the products for this invention have applications involving thermal management of high power semiconductor devices by the use of diamond.

BACKGROUND OF THE INVENTION

Integration of high power electronic devices into electronic systems typically requires the construction of an electronic package. An electronic package is typically comprised of a metal flange onto which is attached an electronic device ("chip"). In some package designs, it is important to insure that the chip does not electrically short to the metal flange, a layer of electrically insulating material is positioned between the device and the flange. A window frame or lead frame may be attached around the device. This frame enables electrical connections via wire bonds or other techniques from the chip to the outside of the package. For environmental protection of the chip, a cap attached over the flange may seal the package. The electronic package is then attached to a heat sink, which may be a metal element in contact with a cooling medium such as air, fluorocarbon liquid, and the like.

High power devices such as those used in high speed computing, microwave and RF telecommunications, and the like typically use ceramic materials such as aluminum oxide, beryllium oxide or aluminum nitride as materials. These materials are cut to shape from sheets, or molded to shape, and are readily attached into electronic packages using conventional solders or brazes. As the power electronic devices are miniaturized, and their power output is increased, their operating temperature is dramatically increased. These ceramic materials have relatively low thermal conductivity compared to diamond (aluminum oxide= 20 W/mK (watts/meter/°K), beryllium oxide=260 W/mK, aluminum nitride=170 W/mK). Therefore, they provide a relatively high thermal resistance between the chip and the flange, which ultimately limits the operating power and reliability of the chip.

Because of its properties, Chemical Vapor Deposition ("CVD") diamond is the ultimate electrical insulator for high power device applications. CVD diamond has extremely high electrical resistivity, high breakdown voltage and high thermal conductivity of 1,000 to 2,000 W/mK, up to four times that of copper. Because of its high thermal conductivity, a diamond layer of significant thickness (typically at least 200 microns thick) also functions as a heat spreader, effectively spreading the heat from the localized area at the chip to a larger area at the flange and ultimate heat sink. However, the use of diamond as an electrical insulator in high power electronic devices has been limited because of the cost of manufacturing diamond components, and the inability to reliably attach diamond into device packages using established methods.

Recently, as the manufacturing cost of diamond has declined with improved CVD synthesis techniques, the demand for diamond components has increased. The need for CVD diamond in high power density applications is rapidly increasing as the package sizes decrease and package power increases. Therefore, it is likely that if a robust method for attaching diamond into electronic packages could be developed, diamond heat spreaders and components would be used in almost every application where enhanced thermal management is vital to prolong the life of microelectronic packages. This is especially true for computer chips, associated power supplies and high-frequency telecommunications.

The two most common joining technologies that are used in microelectronic packaging are soldering and brazing. Each of these methods requires metallization of the components and subsequent heating to perform the attachment. Soldering is typically defined as attachment in which requires at temperature of less than 500° C. to melt metal layers and join the components, while brazing requires a temperature greater than 500° C. to melt the metal layers and join the components.

Solderable metallizations to diamond, such as a multilayer structure of titanium, platinum, gold, followed by gold-tin eutectic solder are well-established. An advantage to the solderable metallizations for diamond is the low attachment temperature, which minimizes thermal stresses resulting from the difference in thermal expansion coefficient between diamond and most materials, especially metals. However, due to the tendency of void formation in soldering, intimate thermal contact may be limited for large areas without specialized bonding techniques.

Brazing is the preferred attachment method for high power electronic packages since the high temperatures involved in the brazing process, typically around 800° C. or greater, usually ensure a very good wetting of the braze material at the interface between two components. It is important that there are no voided areas at the component interfaces that are involved in thermal transfer, since any voids would increase the overall thermal resistance of the package.

The interfaces joined by brazing are usually between the insulator, i.e., diamond, and electrical lead frame or flanges. The electrical leads must be able to pass a peel test, and hence the adhesion between the diamond and the leads must be extremely good. Typically, a peel strength of 2.0 pounds minimum at 90° is required for leads of 0.15" in width.

One of the established industrial methods of achieving interface wetting is the use of hydrogen in the atmosphere during the brazing process, since metal oxide formation is prevented. An eutectic alloy, such as Cu—Sil (72% silver, 28% copper), is commonly used for joining articles in brazing processes, but other brazeable materials such as pure copper and gold may be used as well. The Cu—Sil alloy melts at 780° C. and wets extremely well to nickel and copper surfaces in an atmosphere of nitrogen containing from 2% up to perhaps 75% hydrogen. Brazing temperatures for Cu—Sil are typically as high as 820° C.

To-date, it has been difficult to produce reliable brazeable metallization structures for diamond in microelectronic packages. These difficulties are due to the significant differences in the coefficient of thermal expansion between diamond and metals and also to the chemical nature of the metals comprising the metallization structure.

Many methods are currently known for fabricating diamond products suitable for electronic applications.

However, they all have the disadvantage of not being able to withstand brazing temperatures, i.e., temperatures in the range of about 500 to 1100° C.

Iacovangelo, et al., U.S. Pat. Nos. 5,324,987 and 5,500,248 describe the use of a diamond product for electronic applications, but which are not suitable for use at such brazing temperatures. One example of the disclosed product is a diamond having an adhesion-promoting material interposed between the diamond and the conductive metal, e.g. copper. The adhesion-promoting material is titanium or a titanium-tungsten alloy. It is believed that the metallization in such a product becomes delaminated when the temperature is increased to brazing temperatures in a standard hydrogen-nitrogen-containing brazing atmosphere because of hydride or nitride formation.

Iacovangelo, et al., U.S. Pat. No. 5,529,805 describe fabrication of brazeable diamond tool inserts using a substantially non-oxidizable nickel protective layer deposited onto a chromium metal layer bonded to the diamond component in a nitrogen-free atmosphere.

Iacovangelo, et al., U.S. Pat. No. 5,567,985 describe an electronic structure comprising a CVD diamond substrate, a tungsten-titanium bond layer, a silver compliant layer, a tungsten-copper layer and a gold solder bond outer layer. Such a structure is capable of surviving a thermal shock of temperature in the range of −65 to 150° C. However, such a structure is not capable of surviving brazing in nitrogen-containing atmosphere at temperatures in the range of about 750 to 1100° C. without delamination.

From the above discussion it is clear that a diamond product and a method are needed for fabrication of a brazeable diamond component that is extremely robust in terms of adhesion to electrical leads and flanges. There is also a need a diamond component that may be strongly bonded to other package components in a hydrogen-containing and nitrogen-containing brazing atmosphere without delamination. If a hydrogen-containing brazing atmosphere is used, the diamond becomes electrically non-insulating provided that the brazing temperature is sufficiently high.

SUMMARY OF THE INVENTION

The product of the present invention includes a diamond component, a chromium metal adhesion layer, a refractory metal barrier layer covering the chromium layer, and a metal wetting layer for joining that covers the refractory metal layer. The diamond component used in the product of this invention is preferably a CVD diamond. Typically, the diamond component is grown in flat sheets to a specified thickness, then separated from the growth substrate. The diamond sheets are polished to the required thickness and surface roughness while the opposing surfaces are kept parallel within a given specification. Typical thickness is in the range of about 100 to 1000 micrometers, preferably about 300 to 500 micrometers. Typical average surface roughness of the diamond surface is 1000 Å or less. Laser machining can be performed, if necessary, prior to metallization in order to make via holes ("vias") or define the diamond surface dimensions. The deposition of the metal layers is performed sequentially by vacuum deposition methods such as magnetron sputtering, thermal or electron beam evaporation, ion plating or CVD.

The method of the present invention for fabricating a brazeable diamond product comprising the steps of:

(a) depositing the chromium metal adhesion layer onto a surface of the diamond component described above so that the chromium metal layer and the diamond form a strong interface there between and have a thickness of about 150 to about 15,000 Å;

(b) depositing a barrier layer of the refractory metal onto the chromium metal adhesion layer and have a thickness of about 150 to about 15,000 Å;

(c) depositing an outer layer of a metal from the group consisting of copper, silver, gold and mixtures thereof onto the barrier layer; and (d) recovering a product having at least three layers deposited on the diamond for use in electronic packages.

The chromium metal is first deposited to cover the surface of the diamond that is to be brazed. Preferably the chromium layer has thickness in the range of about 200 to about 10,000 Å. The optimum thickness for complete chromium coverage is at least about 1000 Å. Preferably the refractory metal barrier layer is deposited to a thickness in the range of about 200 to about 10,000 Å. For the barrier layer to achieve optimum performance, and complete coverage of the chromium adhesion layer, the optimum thickness is at least about 1000 Å. The refractory metal barrier layer comprises tungsten, molybdenum, tantalum, niobium, a chromium alloy of the refractory metal, and mixtures thereof. The chromium alloy has about 1 to 20 atomic weight chromium. Tungsten and tungsten-chromium alloys are preferred refractory barrier layers. Finally, the outer or top layer of metal that wets to the braze material, such as copper, silver, gold, is deposited to a thickness from about 200 to 50,000 Å, depending on the particular metal and the brazing temperature. Preferably, the outer layer is copper or silver with a thickness of about 20,000 Å. When the outer layer is gold, preferably the thickness is in the range of about 200 to about 2,000 Å.

The top layer provides a joining layer, contributes to the electrical conduction required in the design of the electronic package, and remains virtually insoluble with the diffusion barrier layer. Because copper, silver and gold are also relatively soft in terms of yield strength, this top layer is somewhat compliant, which lends itself to the robust nature of the metallization when joining materials with a large difference in the coefficient of thermal expansion. The resulting metalized multilayers of the electronic package are easily chemically or sputter etched by conventional photolithographic methods for electrical isolation of devices.

DETAILED DESCRIPTION OF THE INVENTION

The present invention substantially reduces or eliminates the disadvantages and shortcomings associated with the prior art techniques by providing for the deposition of the multilayers of metals that form a brazeable diamond structure. Optionally after the deposition of the multilayer structure, the coated diamond may be annealed by heating to temperatures of about 850° C. for a time such as about 3 minutes. Although this step is unnecessary, it is believed to form an interfacial chromium carbide layer that produces a more robust adhesion and stabilizes the metallization structure for subsequent high temperature processing.

In another embodiment of the method of the present invention, vias in diamond that contain brazeable metallization structures are formed. First, vias in diamond are typically made by laser machining. The shape of vias may have any cross-sectional shape, such as circular or square. The typical vias are cylindrical. The vias may also include the tapering such that the wall of the vias are not perpendicular to the plane of diamond surface, but rather at an angle. The purpose of making the via walls tapered is to increase the amount of material deposited during physical vapor deposition. Tapering the via walls increases the capture cross-section of the vias walls with respect to the material vapor stream during processing in a vacuum chamber operating at less than $1 \times 10^{31\ 5}$ Torr.

Secondly, whereas the purpose of vias are for electrical conduction through the structure, the vias walls are coated with an interfacial layer that provides an adhesion interface between the diamond and any electrically conductive material used for filling the vias that is suitable for the particular application. This is accomplished by first depositing onto the via walls a multilayer metallization structure that is capable of withstanding the aforementioned brazing environment. For example, the multilayer brazeable metallization structure of the present invention can be deposited onto the side of the diamond with tapered vias such that the vias are exposed with their widest diameter towards the deposition flux. A heat treating process is performed to stabilize the bond between of this interfacial coating to the diamond via walls. This is typically done at temperatures in the range of about 800 to 1000° C. in pure argon or nitrogen, either of which may contain 4% hydrogen, for 2 to 10 minutes.

Thirdly, a conductive material made from any combination of the more conductive family of metals, such as copper, silver, or gold, is placed into the vias by a number of methods. Methods may include, but not limited to, electroplating or screen-printing. These methods are both economical in terms of manufacturing.

In the case of screen-printing, a metal stencil is generally used to print a thick film paste, containing metals, oxides and/or frits, and organic components, into the vias by proper alignment of the apertures in the stencil with the vias. The paste becomes conductive after the organic constituents are removed by firing at high temperatures, usually above 300° C. Oxides and/or glass frits in the paste reduce the shrinkage of the paste upon firing due to volatile organic components and reduce the coefficient of the thermal expansion of the conductive material. The thick film pastes are typically fired (sintered) at 800 to 1000° C. to become cohesive and to bond to the brazeable metallization structure of the present invention. The process of filling vias by stencil printing and firing may be repeated until the vias in the structure are satisfactorily filled by the conductive component of the paste after firing off the organic components.

EXAMPLES

The following examples are provided to enable those skilled in the art to clearly understand and practice the present invention. These examples of sample preparation and deposition should not be considered as a limitation in the scope of the present invention, but merely as a set of illustrative examples thereof. In the examples below, sheets of polycrystalline CVD diamond, grown by the method of hot filament chemical vapor deposition, were polished to an average surface roughness of 300 Å on one side and 1,000 Å on the other side. After polishing, the structures were cleaned in a mixture of hydrofluoric acid and nitric acid to remove contaminants and heated treated in air at 500° C. for one hour to remove organic residue and graphitic carbon from the diamond surface. After this treatment, the CVD diamond was metallized in a vacuum chamber.

Example 1

Diamond components were prepared as described above and were mounted onto a rotating substrate platen in a vacuum chamber, equipped to sputter-deposit up to three different metal layers by DC magnetron sputtering. The vacuum chamber was evacuated to a base pressure of less than about $1 \times 10^{-6}$ Torr. Prior to deposition of the metal layers, the diamond components were sputter-etched by a beam of argon ion generated in a Kaufman-type ion source. The metal layers were deposited on the diamond components with <300 Å (mirror) and <1000 Å (matte) average surface roughness in the following sequence: (1) 1,000 Å of chromium, (2) 1,000 Å of tungsten-chromium alloy (5 atomic % chromium) and (3) 12,000 Å of copper as the top layer. Upon completion of the deposition of the three layer metallization structure on the diamond components, the vacuum chamber was vented, and the metallized components were removed.

Example 2

Metallized diamond components with 300 Å and 1000 Å average surface roughness were prepared by the procedure described in Example 1, except the metal layers were deposited in the following sequence: (1) 1,000 Å of chromium, (2) 1,000 Å of tungsten-chromium alloy (5 atomic % chromium) and (3) 12,000 Å of silver as the top layer.

Example 3

Metallized diamond components with 300 Å and 1000 Å average surface roughness were prepared by the procedure described in Example 1, except the metal layers were deposited in the following sequence: (1) 1,000 Å of chromium, (2) 1,000 Å of tungsten and (3) 12,000 Å of copper as the top layer.

Comparative Example 4

Metallized diamond components with 300 Å and 1000 Å average surface roughness were prepared by the procedure described in Example 1, except the metal layers were deposited in the following sequence: (1) 1,000 Å of chromium, (2) 1,000 Å of tungsten, (3) 300 Å of chromium, and (4) 12,000 Å copper as the top layer.

Comparative Example 5

Metallized diamond components with 300 Å and 1000 Å average surface roughness were prepared by the procedure described in Example 1, except the metal layers were deposited in the following sequence: (1) 1,000 Å of chromium, (2) 1,000 Å of tungsten, (3) 150 Å of chromium, (4) 12,000 Å of copper as the top layer.

Example 6

Metallized diamond components with 300 Å average surface roughness were prepared by the procedure described in Example 1, except the metal layers were deposited in the following sequence:
(1) 1,000 Å of Cr,
(2) 1,200 Å of W—Cr alloy (5 atomic % Cr),
(3) 110 Å Au,
(4) 400 Å of W—Cr alloy (5 atomic % Cr),
(5) 225 Å of Au,
(6) 400 Å of W—Cr alloy (5 atomic % Cr),
(7) 450 Å of Au,
(8) 400 Å of W—Cr alloy (5 atomic % Cr),
(9) 900 Å of Au,
(10) 400 Å of W—Cr alloy (5 atomic % Cr),
(11) 1,800 Å of Au,

(12) 400 Å of W—Cr alloy (5 atomic % Cr),
(13) 3,600 Å of Au,
(14) 400 Å of W—Cr alloy (5 atomic % Cr),
(15) 7,800 Å of Au,
(16) 400 Å of W—Cr alloy (5 atomic % Cr),
(17) 16,000 Å of Au as the top layer.

In all of the above examples, the metallized diamond components were heated at 800 to 825° C. for 5–10 minutes in an atmosphere containing pure argon, nitrogen, or 4% hydrogen in nitrogen prior to brazing. However, this heat-treating step is considered optional. In addition, samples from the experiments were mounted with Cu—Sil alloy preforms between the metallized surface of the diamond and a copper-tungsten flange or a lead comprised of nickel or Alloy 42. The assembly was placed in a brazing furnace, with an atmosphere containing argon, nitrogen, or 4% hydrogen in nitrogen for 5 minutes to join the diamond with the other metal or metallized components. In all examples, the adhesion between the components was found to be very strong and no delamination occurred.

After about ten minutes of the heat-treating step, chromium migrated or diffused to the surface of the metalized diamond component in Comparative Example 4. This migration inhibits the wettability of the product. By diminishing the thickness of the chromium layer as in Comparative Example 5, there were fewer tendencies for the chromium to migrate to the surface. However, the additional step of adding a chromium layer between the transition metal layer and the outer layer has been found to be unnecessary to achieve the desired adhesion strength and avoids the risk of chromium migration to the outer surface.

In all of the above examples, both faces of the diamond were sequentially coated and the top metal, being either copper, silver, or gold, is compatible with the braze alloy Cu—Sil. The metallized diamond component from Example 6 has also been verified to have excellent brazing performance in a manufacturing environment utilizing a belt furnace with an atmosphere of 4% hydrogen in nitrogen, using dwell times in the range of about 5 to 15 minutes in the belt furnace, preferably about 10 minutes, at temperatures of about 780 to 820° C.

It was originally believed that the adhesion strength of leads brazed to the metallized diamond component is influenced by the amount of chromium available at the interface between the tungsten and the copper layers. Therefore during the initial experimental work, an intermediate chromium layer was deposited between the refractory metal and the outer. metal layer to ensure adhesion as indicated in Comparative Examples 4 and 5. The thickness of the chromium layer was kept to a minimum to avoid contaminating the copper surface. In order to determine the role of chromium in the adhesion strength, two types of metallizations were deposited on two types of diamond surface finishes. One metallization contained a tungsten-chromium alloy as a combined diffusion barrier and adhesion promoter (5 atomic % Cr), while the other metallization contained a pure tungsten barrier. This result allowed answers to the following questions: (1) whether the chromium in the primary adhesion layer of the structure was able to out-diffuse through the tungsten barrier to the outer metal layer and promote adhesion? or (2) whether it was necessary either to have a separate pure chromium layer between the barrier layer and the outer layer or to have chromium in the barrier layer?

Mirror and matte finishes were used for the diamond surfaces in the examples. The smoother mirror surface is used for die attachment, while the rougher matte surface is used for attaching to a flange or other heat sink material. The surface roughness variations for a standard mirror finish is <300 Å and for a matte finish is <100 Å. Leads made of Alloy 42 (a commercially available 42% nickel-48% iron alloy) with two variations in lead width (0.050" and 0.100") were brazed onto the metallized diamond surfaces with Cu—Sil.

The peel strength of the leads for Examples 1–3 and Comparative Examples 4–5 are set forth Table 1 below. The peel strength results for Examples 1 through 3 were performed by the Quad Group, Inc. using a standard 90° Rigid Substrate Peel Test in which a Romulus® IV Universal Mechanical Strength Tester was used. The Peel Test that was used is substantially the same as that described in the product brochure for the Romulus III Mechanical Strength Tester dated March 1999.

TABLE 1

| Examples and Comparative Examples | Sample | Surface Finish | 0.050" width lead (lb.) | Avg. Value (lb.) | 0.100" width lead (lb.) | Avg. Value (lb.) |
|---|---|---|---|---|---|---|
| Example 1 Cr/W—Cr/Cu 0.1/0.1/1.2μ | 2 | Mirror | 5.01 | NA | 9.11 | NA |
| | 3 | Matte | 5.81 | 5.6 | 9.41 | 8.2 |
| | 4 | Matte | 5.3 | | 6.94 | |
| Example 2 Cr/W—Cr/Ag 0.1/0.1/1.2μ | 5 | Matte | 1.7 | NA | — | 5.62 |
| | 6 | Matte | — | | 5.95 | |
| | 7 | Matte | — | | 5.29 | |
| | 8 | Mirror | — | NA | 6.9 | NA |
| | 9 | Mirror | 3.04 | | — | |
| Example 3 Cr/W/Cu 0.1/0.1/1.2μ | 10 | Matte | 6.6 | 4.4 | 6.89 | 7.9 |
| | 11 | Matte | 4.33 | | 8.65 | |
| | 12 | Matte | 2.17 | | 8.19 | |
| | 13 | Mirror | 5.69 | NA | 9.66 | NA |
| Comparative Example 4 Cr/W/Cr/Cu 0.1/0.1/0.03/1.2μ | 14 | Mirror | NA | NA | At least 3* | NA |
| | 15 | Matte | NA | NA | NA | |
| Comparative Example 5 Cr/W/Cr/Cu 0.1/0.1/0.015/1.2μ | 16 | Mirror | NA | NA | At least 3* | NA |
| | 17 | Matte | NA | NA | NA | NA |

Notes:
1. W—Cr = 5 atomic % tungsten.
2. Leads are Alloy 42.
3. Time was 5–6.5 minutes of dwell at 820° C.
*For a 0.15" nickel lead.
NA = not available.

Comparing the peel test results for Examples 1 and 3 in the following table, the results are essentially identical in terms of robustness. The alloy of 5% chromium in tungsten that was utilized in place of pure tungsten in Example 1 provides no significant improvement in peel strength for these types of metallization structures. This is most likely is an indication that Cr has sufficiently diffused through the W barrier to promote adhesion. This implies that an additional layer of chromium between the barrier layer and the outer layer is not essential to obtaining robust adhesion for this structure. Thus, a structure that is Cr/W/Cu appears to be sufficiently robust given the time and temperature of the brazing. This chromium-tungsten alloy, however, simplifies the fabrication of a brazeable gold layer structure, where a relatively thick layer of gold is used, as in Example 6.

Although the number of data points obtained in Example 2 for Ag as the outer layer is somewhat less, Ag also appears to work well when substituted for Cu of the Example 1 metallization scheme. Since the peel strength is only slightly less than for Cu, Ag also has favorable mechanical properties. Typically, 2.0 pounds of peel strength at 90° is acceptable for leads of 0.15" width.

What is claimed is:

1. A brazeable diamond product, comprising:
   (a) a diamond component;
   (b) a chromium metal layer deposited onto said diamond component, said chromium metal layer and said diamond component forming an interface therebetween;
   (c) a barrier layer comprising a refractory metal selected from the group consisting of tungsten, tantalum, niobium, a chromium alloy of said refractory metal, and mixtures thereof deposited onto said chromium layer; and
   (d) an outer layer comprising a metal selected from the group consisting of copper, silver, gold and mixtures thereof deposited onto said barrier layer.

2. The product of claim 1 wherein said chromium metal layer is bonded to said diamond component by heating said product for a sufficient time to a temperature in the range of about 750 to 1100° C.

3. The product of claim 2 wherein said heating is done in an atmosphere of an inert gas from the group consisting of nitrogen, argon, and helium and containing from 0 to about 75 volume % hydrogen.

4. The product of claim 1 wherein layers (b), (c) and (d) are deposited in a vacuum chamber.

5. The product of claim 4 wherein said layers are deposited by sputter deposition.

6. The product of claim 1 wherein said chromium layer has a thickness in the range of about 200 to about 10,000 Å.

7. The product of claim 1 wherein said barrier layer has a thickness in the range of about 200 to about 10,000 Å.

8. The product of claim 1 wherein said metal for said outer layer is copper or silver and has a thickness in the range of about 200 to about 50,000 Å.

9. The product of claim 1 wherein said metal for said outer layer is gold and has a thickness in the range of about 200 to about 2,000 Å.

10. The product of claim 1 wherein said diamond component has two faces and the three layers are deposited onto both faces of said diamond component.

11. The product of claim 1 wherein said chromium alloy is in the range of about 1 to about 20 atomic % chromium.

12. The product of claim 1 wherein an object comprising a material of the group consisting of a metal, a metallized ceramic, a ceramic, or mixtures thereof is bonded to said outer layer of said product by heating said product for a sufficient time to a temperature in the range of about 25 to 1100° C.

13. The brazeable diamond product of claim 1, wherein the barrier layer comprises tungsten or a tungsten-chromium alloy and the outer layer comprises copper.

14. A brazeable diamond product comprising:
   (a) a diamond component;
   (b) a chromium metal layer deposited onto said diamond component, said chromium metal layer and said diamond component forming an interface there between;
   (c) a barrier layer of a refractory metal selected from the group consisting of tungsten, molybdenum, tantalum, niobium, a chromium alloy of said refractory metal, and mixtures thereof deposited onto said chromium metal layer;
   (d) a layer of a metal selected from the group consisting of copper, silver, gold and mixtures thereof onto deposited onto said barrier layer;
   (e) at least a second chromium metal layer deposited onto said layer of metal;
   (f) a least a second barrier layer of a refractory metal selected from the group consisting of tungsten, molybdenum, tantalum, niobium, a chromium alloy of said refractory metal, and mixtures thereof deposited onto said at least second chromium metal layer;
   (g) at least a second layer of a metal selected from the group consisting of copper, silver, gold and mixtures thereof onto deposited onto said barrier layer to form an outer layer of said diamond product.

15. The product of claim 14 wherein said chromium metal layer is bonded to said diamond component by heating said product for a sufficient time to a temperature in the range of about 750 to 1100° C.

16. The product of claim 14 wherein said heating is done in an atmosphere of an inert gas from the group consisting of nitrogen, argon, and helium and containing from 0 to about 75 volume % hydrogen.

17. The product of claim 14 wherein layers (b) through (g) are deposited in a vacuum chamber.

18. The product of claim 17 wherein said layers are deposited by sputter deposition.

19. The product of claim 14 wherein said chromium layer has a thickness in the range of about 200 to about 10,000 Å.

20. The product of claim 14 wherein said barrier layer has a thickness in the range of about 200 to about 10,000 Å.

21. The product of claim 14 wherein said metal for said outer layer is copper or silver. and has a thickness in the range of about 200 to about 50,000 Å.

22. The product of claim 14 wherein said metal for said outer layer is gold and has a thickness in the range of about 200 to about 2,000 Å.

23. The product of claim 14 wherein said diamond component has two faces and the three layers are deposited onto both faces of said diamond component.

24. The product of claim 14 wherein said chromium alloy is in the range of about 1 to about 20 atomic % chromium.

25. The product of claim 14 wherein an object comprising a material of the group consisting of a metal, a metallized ceramic, a ceramic, or mixtures thereof is bonded to said outer layer of said product by heating said product for a sufficient time to a temperature in the range of about 25 to 1100° C.

* * * * *